United States Patent [19]

Lur

[11] Patent Number: 5,466,630
[45] Date of Patent: Nov. 14, 1995

[54] SILICON-ON-INSULATOR TECHNIQUE WITH BURIED GAP

[75] Inventor: Water Lur, Taipei, Taiwan

[73] Assignee: United Microelectronics Corp., Hsinchu, Taiwan

[21] Appl. No.: 286,341

[22] Filed: Aug. 5, 1994

Related U.S. Application Data

[62] Division of Ser. No. 215,228, Mar. 21, 1994.

[51] Int. Cl.$^6$ .................................................. H01L 21/76
[52] U.S. Cl. ................................ 437/62; 437/24; 437/927
[58] Field of Search ........................... 437/24, 62, 927; 148/DIG. 50, DIG. 73, DIG. 85, DIG. 86

[56] References Cited

U.S. PATENT DOCUMENTS 5,232,866   8/1993   Beyer et al. .............................. 437/62

FOREIGN PATENT DOCUMENTS 62-122143   6/1987   Japan.

*Primary Examiner*—George Fourson
*Attorney, Agent, or Firm*—Ladas & Parry

[57] ABSTRACT

An silicon-on-insulator (SOI) isolation structure of a silicon substrate, which has a buried gap between active regions and the substrate, and supporting pillars formed of an insulating material to support the active regions. The buried gap is formed by etching an implanted buried silicon nitride layer. Since the dielectric constant of the buried gap is about 1, the dielectric effect and isolating effect of this structure are greatly improved.

17 Claims, 5 Drawing Sheets

SILICON-ON-INSULATOR TECHNIQUE WITH BURIED GAP

This is a divisional of co-pending application Ser. No. 08/215,228 filed Mar. 21, 1994.

FIELD OF THE INVENTION

The present invention relates to a silicon-on-insulator (SOI) technique, especially to an SOI structure having a buried gap and a method to produce such a structure.

BACKGROUND OF THE INVENTION

With the continual improvement of semiconductor chip fabrication techniques, the number of devices which can be packed onto a semiconductor chip has increased greatly, while the size of the individual devices have decreased markedly. Today several million devices can be fabricated in a single chip—consider, for example, the mega-bit memory chips which are commonly used today in personal computers and in other applications. In such high-density chips, elements must be insulated properly in order to obtain good performance. The main purpose of element insulation techniques is to provide good insulation between the elements of the devices using smaller insulation area, to provide more space for more devices and their elements.

An effective method of achieving good insulation is the so-called Silicon-On-Insulator (SOI) technique. Structurally it comprises a single-crystal silicon layer deposited on an insulator, usually thinner than 1 µm. An insulation trench can be formed until it reaches the insulator, thereby forming insulated silicon islands on the insulator, where devices can be formed with excellent insulation from devices formed in neighboring islands.

Among SOI techniques, a common technique is Separation by IMplanted OXygen (called "SIMOX"). The SIMOX process steps are shown in FIGS. 1A to 1C and are discussed below.

At first a silicon substrate 10 is provided. Oxygen ions are implanted into the substrate 10 which is thereafter annealed to convert the region implanted by oxygen ions into a buried oxide layer 11 formed in the substrate 10 beneath its surface. Thus, the substrate 10 is divided into two portions, a surface portion 15 and a bottom portion 16 by the buried oxide 11, as is shown in FIG. 1A.

Referring now to FIG. 1B, trenches 12 are formed by etching predetermined regions of the surface 15. Then an isolating material is deposited filling the trenches 12 and forming lateral isolators 13 which divide the surface 15 into a plurality of active regions or islands 14, as is shown in FIG. 1C. The active regions 14 are completely isolated in such a structure.

Although the isolation effect works very well using the SIMOX technique, it suffers from a relatively high parasitic capacitance between the bottom portion 16 and the active regions 14 so that the operating speed of devices formed in the islands 14 is limited. Since the buried oxide layer 11 is formed by implantation, its maximum thickness is about 0.5 µm, therefore the parasitic capacitance can not be reduced. Additionally, many defects and residual stresses appear at the interface between the active regions 14 and the buried oxide layer 11, which reduce the reliability of IC's manufactured using this technology.

SUMMARY OF THE INVENTION

The object of the present invention is to provide an SOI structure, which is capable of reducing parasitic capacitance, junction leakage, body effect, stresses and defects, and has higher breakdown voltage and resistance to radiation than the prior art SOI structure described above.

The above objects are fulfilled by providing an isolation structure of a semiconductor substrate, e.g. a silicon substrate, for insulating an active region thereon, and a method of forming an isolated structure on the substrate. The structure comprises: (1) at least one active region which is preferably surrounded by field oxide; and (2) a plurality of supporting means formed of an insulating material on said substrate, connected between the field oxide and the substrate, to support the active region above the substrate. The method comprises the following steps: (a) forming a buried layer, preferably silicon nitride, in the substrate to divide the substrate into a surface portion and a bottom portion; (b) forming a plurality of supporting pillars at predetermined positions to support the surface portion on the bottom portion; and (d) removing the buried layer.

BRIEF DESCRIPTION OF THE DRAWING

The present invention will become more fully understood from the detailed description given hereinafter with reference to and the accompanying drawings which are given by way of illustration only, and thus are not limitative of the present invention and wherein.

DETAILED DESCRIPTION OF THE PREFERRED EMBODIMENT

A preferred embodiment of the present invention is shown in FIGS. 2A to 2E and 3A to 3E and discussed herein below. These figures shown the formation of an isolated island of silicon in a substrate and only portions of neighboring islands are shown in the figures. Those skilled in the art will appreciate the fact that many, many islands would typically be formed in a given Integrated Circuit (IC).

Step 1

Figure 1A:
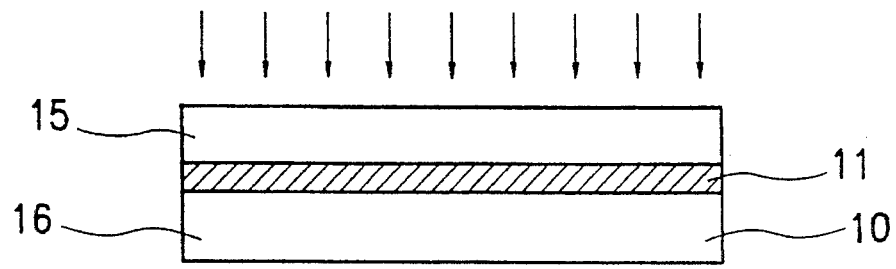
FIGS. 1A to 1C show the process step of the conventional SIMOX process.
Figure 1B:
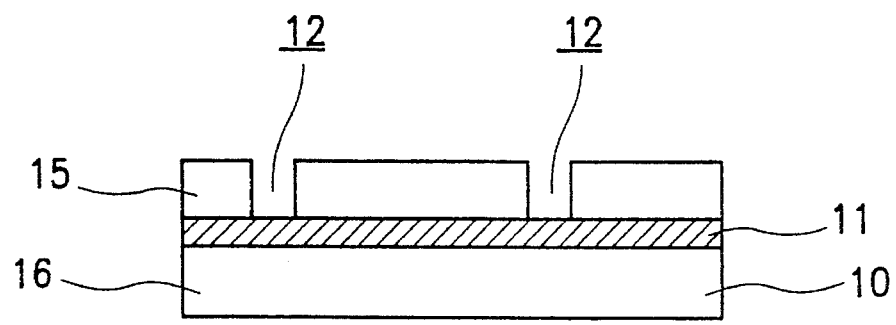
Figure 1C:
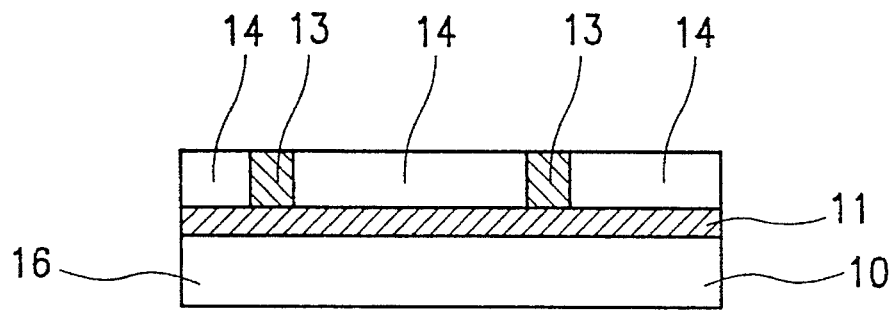
Figure 2A:
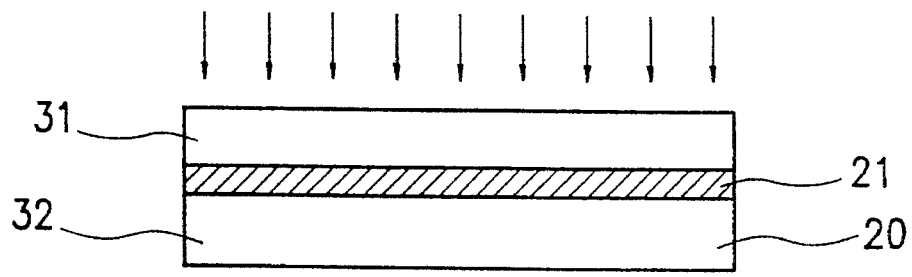
FIGS. 2A to 2E show steps of an SOI process in accordance with a preferred embodiment of the present invention, these figures showing the SOI structure in cross section.
Figure 3A:
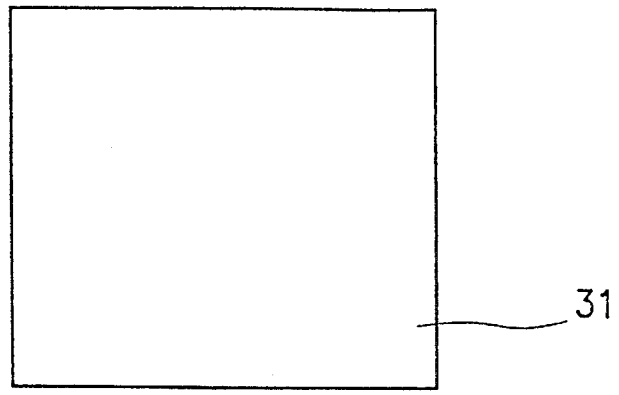
FIGS. 3A to 3E correspond to FIGS. 2A–2E, but show the steps with reference to the SOI structure in plan view.

At first, a buried silicon nitride layer 21 is formed in a silicon substrate 20 by, for example, implanting nitrogen ions into at 30 to 200 KeV with a dosage between $1 \times 10^{18}$ to $3 \times 10^{18}$ atoms/cm$^2$, then annealing the substrate 20 at 1100° C. to 1300° C. for 1 to 5 hours. The buried silicon nitride layer 21 divides the substrate 20 into two portions, a surface 31 and a bottom 32 as shown in FIGS. 2A and 3A.

Step 2

Figure 2B:
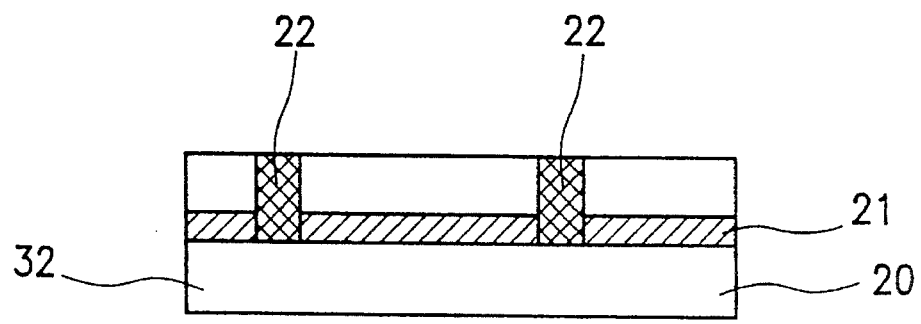
Figure 3B:
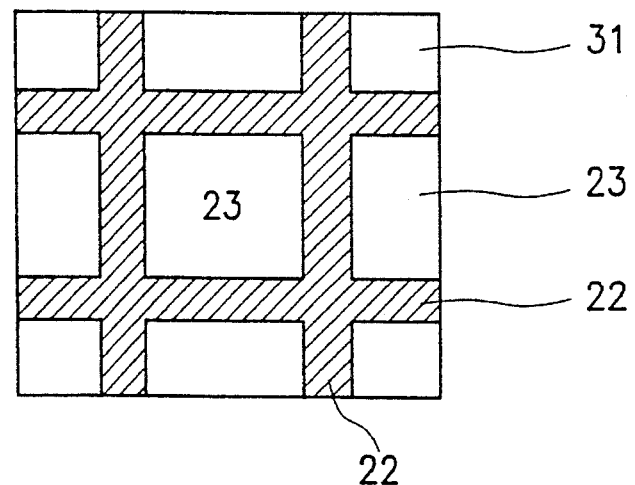

Secondly, predetermined areas on the surface 31 are etched to a depth which reaches the bottom 32, and which are filled with oxide to form supporting pillars 22 as shown in FIGS. 2B and 3B. This can be done by conventional lithography and deposition techniques. For example, a photoresist layer can be coated and patterned on the surface 31. Etching may be done by Reactive Ion Etching (RIE). Oxide can be deposited by chemical vapor deposition (CVD) or liquid phase deposition (LPD) after the RIE. The residual oxide can be removed by wet or dry etching. The pillars are formed in two directions across the surface 31 to define islands 23.

Step 3

Figure 2C:
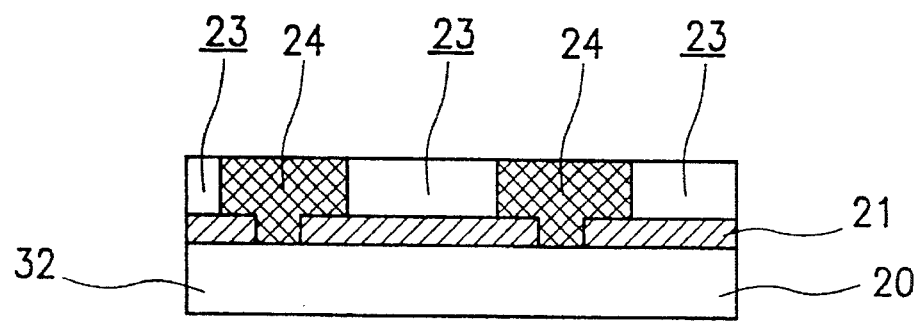
Figure 3C:
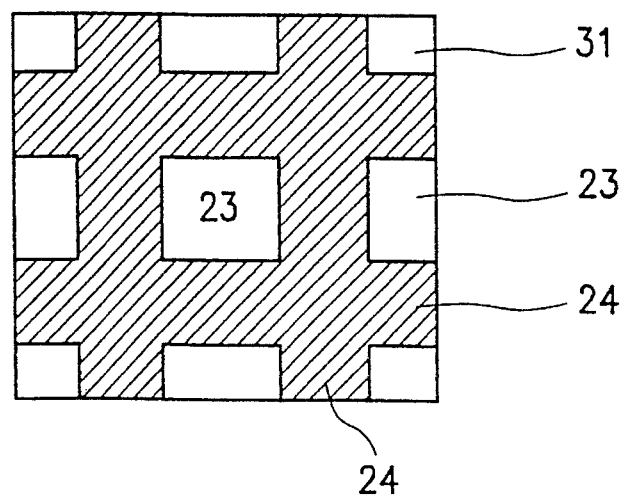

Referring to FIGS. 2C and 3C, field oxides 24 are preferably formed on the surface 31 to define active regions 23' from islands 23. The field oxides 24 are trench-like and amalgamate with supporting pillars 22. The width of field oxides 24 is preferably larger than the diameter of the supporting pillars 22. The field oxides 24 are preferably formed in along the two sides of the pillars 22 and along the pillars 22 in both directions as they crisscross surface 31. The field oxides can be formed by using conventional or modified LOCal Oxidation of Silicon (LOCOS) or trenched oxide techniques known to those skilled in the art.

Step 4

Figure 2D:
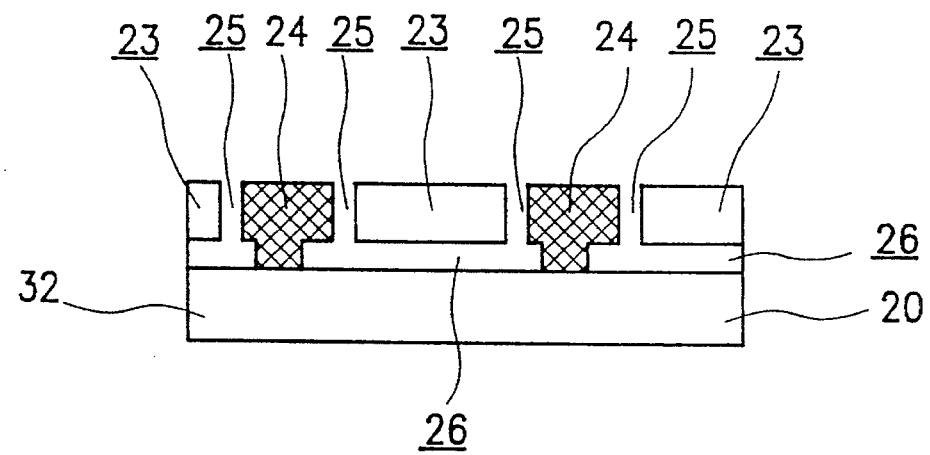
Figure 3D:
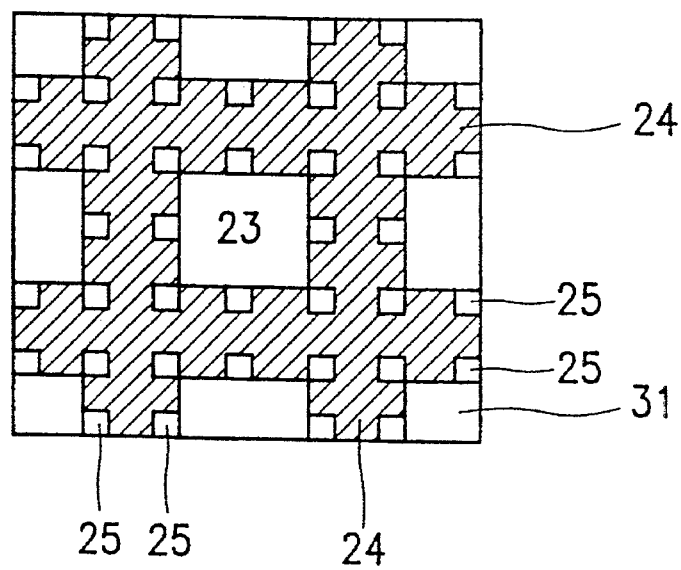

Referring to FIGS. 2D and 3D, a plurality of holes 25 are formed, preferably in the field oxides 24 and near their edges. Holes 25 are sufficiently deep to reach the buried silicon nitride layer 21 and are preferably spaced along all four sides of islands 23'. Then the buried silicon nitride layer 21 is removed to leave a buried gap 26 with the islands being supported by pillars 22 along the sides of the islands 23' where no holes 25 are formed. The holes 25 can be formed by using conventional lithography and etching techniques (for example, as described in step 2). The buried silicon nitride layer 21 can be removed by wet etching. For example, dipping the substrate 20 into a hot phosphoric acid solvent will etch silicon nitride and the phosphoric acid solvent will enter the substrate 20 through holes 25 and etch away the buried silicon nitride layer 21. After the etching process is completed, the buried silicon nitride layer 21 is gone leaving in its place a gap 26 under the active regions or islands 23'.

Step 5

The holes 25 are preferably closed by an isolating material 28, e.g. silicon oxide or silicon nitride. The substrate 20 is preferably annealed to remove defects. The substrate 20 can be annealed at 900° C. to 1000° C. If desired, a thin oxide layer 27 can be formed on the surfaces facing gap 26 to achieve an even better isolation effect by, for example, thermal growing the oxide layer 27 in an oxygen environment to obtain the structure shown in FIG. 2E. The closing step can be done by conventional deposition techniques, for example, depositing an isolator 28, either silicon oxide or silicon nitride or other suitable material, by physical vapor deposition (PVD) or by CVD, to fill holes 25, as is shown in FIGS. 2E and 3E.

After the above described isolation structure is completed, elements can be than formed on the active regions 23' using conventional techniques to produce electronic devices as is well known by those skilled in the art.

Figure 2E:
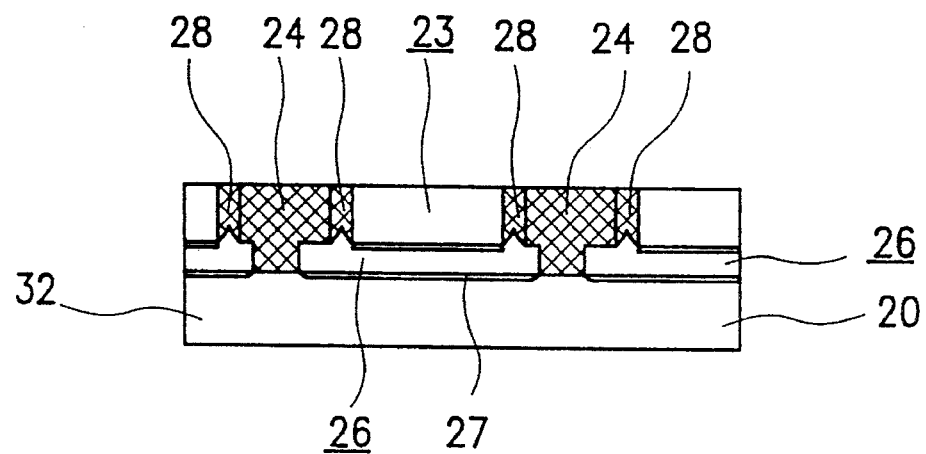
Figure 3E:
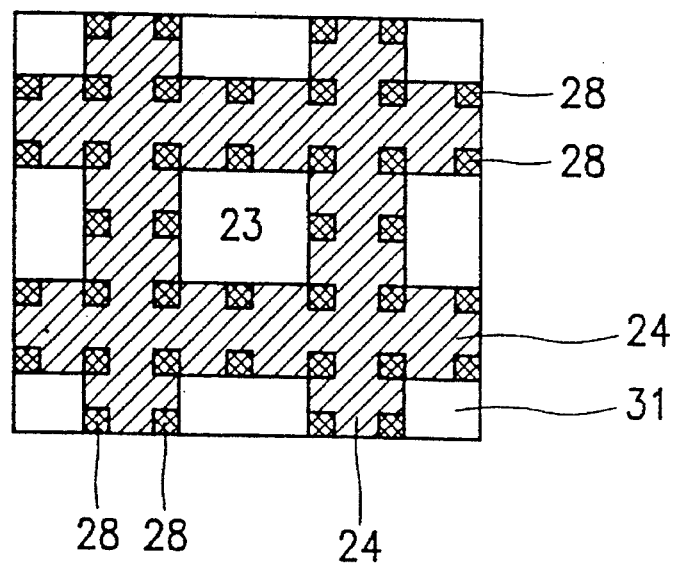

In the isolation structure shown in FIGS. 2E and 3E, active regions 23' are isolated from the bottom 32 of the substrate 20 by a buried gap 26, with or without gases allowed to be therein. Since the dielectric constant of the buried gap 26 is about 1, the dielectric isolation effect of the buried gap 26 is much better than conventionally used isolating materials like silicon oxide, silicon nitride, etc. that have much higher dielectric constants. The parasitic capacitance between active regions and substrate is greatly reduced, therefore the high frequency response of devices formed in regions or islands 23' is improved, hence the devices can be operated at a much higher speed, Therefore the present invention is especially suitable for use in connection in high speed device applications, like radar or satellite communications.

Also, since a gap 26 is disposed between the active regions 23' and the substrate 20, almost no leakage and body effect are possible. Therefore, the structure can be beneficially used in low power applications.

Moreover, the structure is resistive to radiation, because there is no junction between the active regions and the substrate.

Additionally, the breakdown voltage of the structure is several times higher than conventional SOI structures. Thus the disclosed structure is more suitable to high voltage application, like power ICs (integrated circuits), than conventional SOI structures.

Since the buried layer is removed and leaves a room for crystal lattices to re-grow, the stresses and defects appear at the junction between the active regions and the substrate can be annealed out, thus the reliability of the device formed thereon is greatly improved, comparing with conventional SOI structures.

Finally, in the structure, the processes are simplified, because a channel stop implantation layer is not needed. Also, the structure can be made using conventional CMOS processing techniques, so that it can be readily adapted for use with Integrated Circuits (ICs) currently being made to improve them along the lines discussed above.

While the invention has been described by way of an example and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures. For example, the invention has been described in the context of forming a silicon nitride layer 21 and silicon oxide pillars 22. Alternatively, the layer 21 could be oxide and the pillars 22 could be nitride. Indeed, the layer 21 should be of a material which is different from the pillars which support the islands 23' so that the layer 21 can be selectively etched away allowing the pillars 22 to remain and support the islands 23'. Also, if the pillars are made sufficiently wide then step 3 may be eliminated, if desired, since the holes 25 may be formed in portions of the pillars which face and are adjacent to islands 23'.

What is claimed is:

1. A method of forming an isolated structure on a semiconductor substrate, which method comprises the steps of:

(a) forming a buried layer in said substrate to divide said substrate into a surface portion and a bottom portion;

(b) forming a plurality of supporting pillars at positions in the surface portion and buried layer to support the surface portion on the bottom portion, the supporting pillars being formed of an insulating material which is different insulating material forming the buried layer; and (c) removing the remaining buried layer.

2. A method of forming an isolated structure on a semiconductor substrate as claimed in claim 1, including the steps of:

(d) forming a plurality of holes in the surface portion which penetrates the surface portion to the buried layer;

(e) dipping said substrate into an etchant to etch away the buried layer to define a gap; and (f) closing the holes.

3. A method of forming an isolated structure on a semiconductor substrate as claimed in claim 2, wherein step (f) is performed by depositing an insulating material in the holes.

4. A method of forming an isolated structure on a semiconductor substrate as claimed in claim 3, wherein the insulating in the holes material is silicon nitride.

5. A method of forming an isolated structure on a semiconductor substrate as claimed in claim 3, wherein the insulating in the holes material is silicon oxide.

6. A method of forming an isolated structure on a semiconductor substrate as claimed in claim 2, wherein the step (c) further includes forming an oxide layer on facing surfaces in said gap.

7. A method of forming an isolated structure on a semiconductor substrate as claimed in claim 2, wherein the step (c) further includes:

(c1) forming an oxide layer on facing surfaces of the surface portion and the bottom portion after the buried layer is removed; and (c2) annealing said substrate.

8. A method of forming an isolated structure on a semiconductor substrate as claimed in claim 2, wherein the step (c) further includes:

annealing said substrate after the buried silicon nitride layer is removed.

9. A method of forming an isolated structure on a semiconductor substrate as claimed in claim 1, wherein the buried layer is silicon nitride.

10. A method of forming an isolated structure on a semiconductor substrate as claimed in claim 9, wherein phosphoric acid is used as an etchant to etch away the buried layer.

11. A method of forming an isolated structure on a semiconductor substrate as claimed in claim 9, wherein the pillars are formed from silicon oxide.

12. A method of forming an isolated structure on a semiconductor substrate as claimed in claim 11, wherein the pillars are formed by forming trenches in the substrate and buried layer and filling said trenches with silicon oxide.

13. A method of forming an isolated structure on a semiconductor substrate as claimed in claim 11, wherein step (c) further includes forming an oxide layer on facing surfaces in said gap.

14. A method of forming an isolated structure on a semiconductor substrate as claimed in claim 1, wherein the step (c) further includes forming an oxide layer on facing surfaces of the surface portion and the bottom portion after the buried layer is removed; and annealing said substrate.

15. A method of forming an isolated structure on a semiconductor substrate as claimed in claim 1, wherein the step (c) further includes annealing said substrate after the buried layer has been removed.

16. A method of forming an isolated structure on a semiconductor substrate as claimed in claim 1, wherein the step (a) is performed by implanting nitrogen ions into said substrate at 30 KeV to 200 KeV with a dosage between $1\times10^{18}$ to $3\times10^{18}$ atoms/cm$^2$ and then annealing said substrate at 1100° C. to 1300° C. for 1 to 5 hours.

17. A method of forming an isolated structure on a semiconductor substrate as claimed in claim 1, wherein step (b) is performed by etching said substrate in the buried layer at the positions by reactive ion etching, and then depositing an oxide therein.

\* \* \* \* \*